United States Patent
Inoue et al.

(10) Patent No.: US 10,056,896 B2
(45) Date of Patent: Aug. 21, 2018

(54) SWITCHING ELEMENT DRIVING DEVICE

(71) Applicant: DENSO CORPORATION, Kariya, Aichi-pref. (JP)

(72) Inventors: Norihiko Inoue, Kariya (JP); Masashi Irie, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/577,796

(22) PCT Filed: Apr. 26, 2016

(86) PCT No.: PCT/JP2016/002181
§ 371 (c)(1),
(2) Date: Nov. 29, 2017

(87) PCT Pub. No.: WO2016/203691
PCT Pub. Date: Dec. 22, 2016

(65) Prior Publication Data
US 2018/0159526 A1    Jun. 7, 2018

(30) Foreign Application Priority Data

Jun. 17, 2015  (JP) .................................. 2015-122003

(51) Int. Cl.
| | | |
|---|---|---|
| H03K 17/12 | (2006.01) | |
| H03K 17/22 | (2006.01) | |
| H03K 17/567 | (2006.01) | |

(52) U.S. Cl.
CPC ........... *H03K 17/122* (2013.01); *H03K 17/22* (2013.01); *H03K 17/567* (2013.01); *H03K 2217/0036* (2013.01)

(58) Field of Classification Search
CPC ...... H03K 17/10; H03K 17/102; H03K 17/12; H03K 17/122; H03K 17/22; H03K 17/567; H03K 2217/0036
USPC ...................... 326/82, 83; 327/108, 109, 111
See application file for complete search history.

(56) References Cited

U.S. PATENT DOCUMENTS

| | | | |
|---|---|---|---|
| 2012/0099234 A1 | 4/2012 | Inoue et al. | |
| 2016/0043647 A1* | 2/2016 | Rapisarda | H02M 3/33507 363/21.12 |
| 2017/0084404 A1* | 3/2017 | Jiang | H03K 17/6874 |

FOREIGN PATENT DOCUMENTS

| | | |
|---|---|---|
| JP | 06-244702 A | 9/1994 |
| JP | 2010-226835 A | 10/2010 |
| JP | 2014-155393 A | 8/2014 |
| JP | 2014-155409 A | 8/2014 |

* cited by examiner

*Primary Examiner* — William Hernandez
(74) *Attorney, Agent, or Firm* — Posz Law Group, PLC

(57) ABSTRACT

A switching element driving device includes: a drive circuit that is connected between an element driving power supply and a circuit ground and outputs a driving signal to a driving switching element; a capacitor that is connected between the circuit ground and a reference ground to which a potential reference side conduction terminal of the driving switching element is connected; and a regulator that charges and discharges so that the capacitor has a predetermined terminal voltage. The regulator discharges the capacitor when the terminal voltage exceeds an upper limit value, and charges the capacitor when the terminal voltage falls below a lower limit value.

10 Claims, 12 Drawing Sheets

$V_{thH} = V_{D2}$
$V_{thL} = V - V_{D1}$

SWITCHING ELEMENT DRIVING DEVICE

CROSS REFERENCE TO RELATED APPLICATIONS

This application is a U.S. national stage of International Patent Application No. PCT/JP2016/002181 filed on Apr. 26, 2016 and is based on Japanese Patent Application No. 2015-122003 filed on Jun. 17, 2015, the disclosures of which are incorporated herein by reference.

TECHNICAL FIELD

The present disclosure relates to a driving device connected between an element driving power supply and a circuit ground and outputting a driving signal to a driving switching element.

BACKGROUND ART

Some types of voltage-driven semiconductor elements require application of a negative voltage to a conduction control terminal, that is, the gate, when turned off. Patent Literature 1 discloses a configuration in which the emitter potential of a semiconductor switching element 4a is controlled by an amplifier 7 so as to apply voltage of positive and negative polarities across the emitter and the gate of the switching element 4a. Patent Literature 2 discloses a configuration in which a drive power supply voltage is divided by a series circuit of capacitors 21 and 22 and the divided potential is applied to the emitter of an IGBT 2 so as to likewise apply voltage of positive and negative polarities.

PRIOR ART LITERATURES

Patent Literature

Patent Literature 1: JP 2012-90435 A
Patent Literature 2: JP 2010-226835 A

SUMMARY OF INVENTION

In the configuration of Patent Literature 1, every time the gate is charged and discharged to turn on and off the switching element 4a, a charge current is drawn from the power supply via the amplifier 7, or a discharge current flows from the gate to the ground via the amplifier 7, so that the amount of current consumption is increased. In the configuration of Patent Literature 2, every time the gate is charged and discharged, the voltage at both ends of the capacitors changes, and a constant voltage circuit 30 charges and discharges the capacitors 21 and 22 to compensate for the voltage changes, which also causes an increase in the amount of current consumption.

It is an object of the present disclosure to provide a switching element driving device capable of applying voltage of both polarities to a conduction control terminal of a switching element while reducing current consumption.

A switching element driving device according to one example of the present disclosure includes: a drive circuit that is connected between an element driving power supply and a circuit ground and outputs a driving signal to a driving switching element; a capacitor that is connected between the circuit ground and a reference ground, to which a potential reference side conduction terminal of the driving switching element is connected; and a regulator that charges and discharges the capacitor so as to keep a predetermined terminal voltage of the capacitor. The regulator discharges the capacitor when the terminal voltage exceeds an upper limit value, and charges the capacitor when the terminal voltage falls below a lower limit value.

With this configuration, when power is input to the driving device, the regulator performs initial charging on the capacitor until the lower limit value is exceeded, so that the circuit ground is lower in the potential by the terminal voltage of the capacitor than the reference ground. For example, when the reference ground is 0V, the potential will be negative for the circuit ground. The drive circuit charges the conduction control terminal of the driving switching element when turning on the driving switching element. The charge current flowing at this time also charges the capacitor via the potential reference side conduction terminal.

The drive circuit discharges the driving switching element from the conduction control terminal when turning the driving switching element off. The discharge current flowing at this time also discharges the capacitor via the potential reference side conduction terminal. Since the drive circuit can drive the conduction control terminal to have a negative potential at this time, it may be possible to prevent self turn-on of the driving switching element.

Since the charge of the capacitor when being charged and discharged as the drive circuit turns on and off the driving switching element is basically equal, the terminal voltage fluctuations of the capacitor will occur within a fixed range. Thus, by appropriately setting the capacitance of the capacitor in relation to the capacity of the driving switching element, it may be possible to fall the terminal voltage fluctuations within the voltage range from a lower limit value to an upper limit value that are set for the regulator.

Since the voltage range corresponds to the OFF region where the regulator does not operate, the regulator does not perform charging or discharging and does not consume any current when the drive circuit only turns on and off the driving switching element. The regulator operates to charge or discharge the capacitor when the terminal voltage fluctuates beyond the voltage range due to other factors. Thus, it may be possible to reduce the current consumption as compared to conventional configurations.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

First Embodiment

Figure 1:
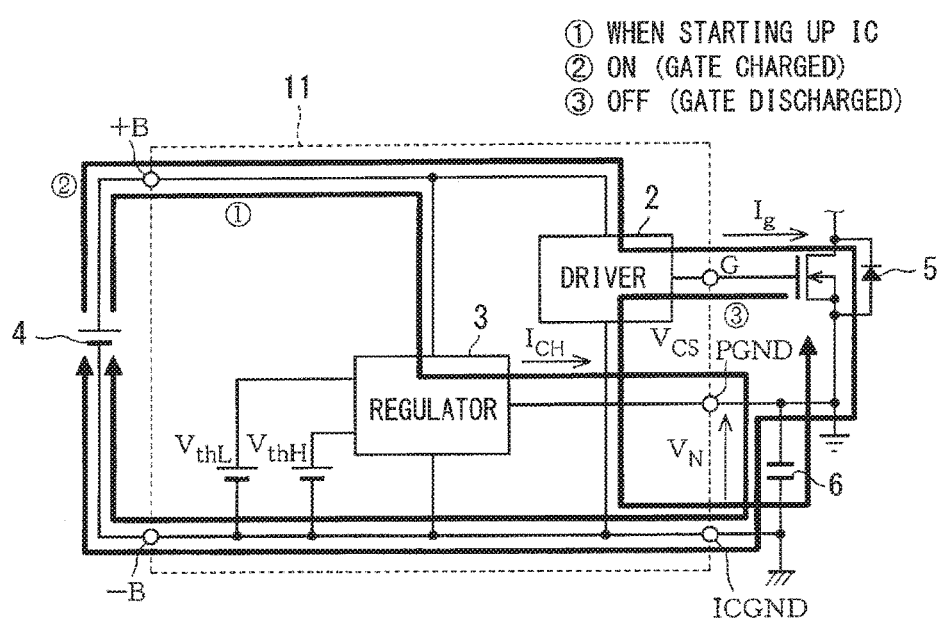
FIG. 1 is a diagram illustrating an electrical configuration of a driving device according to a first embodiment.

As shown in FIG. 1, the driving device 1 of the present embodiment includes a driver 2 corresponding to a drive circuit, and a regulator 3 with an OFF region. The regulator 3 with an OFF region is simply referred to as "regulator 3" hereinafter. A positive terminal and a negative terminal of a power supply 4, which corresponds to an element driving power supply, are connected to power supply terminals +B and −B of the driving device 1 respectively outside the driving device 1. The driver 2 and the regulator 3 are both connected between the power supply terminals +B and −B.

The driving device 1 also includes an output terminal G, a reference ground terminal PGND, and a circuit ground terminal ICGND. The source of an N-channel MOSFET 5, which is a driving switching element, is connected to the terminal PGND, while the gate is connected to the terminal G. The source, which corresponds to a potential reference side conduction terminal, is connected to the reference ground. Although not specifically shown, the drain of the FET 5 is connected to a load, for example, or to the source of an FET that will be an upper arm when the FET 5 is a lower arm.

A capacitor 6 is connected between the terminal PGND and the terminal ICGND outside the driving device 1. The power supply output terminal of the regulator 3 is connected to the terminal PGND, so that the regulator 3 charges and discharges the capacitor 6. Reference voltages $V_{thH}$ and $V_{thL}$ are provided to the regulator 3, the former corresponding to an upper limit value, and the latter corresponding to a lower limit value. Reference voltages $V_{thH}$ and $V_{thL}$ are referred to as upper limit voltage $V_{thH}$ and lower limit voltage $V_{thL}$, respectively. When the terminal voltage $V_N$ of the capacitor 6 falls below the lower limit voltage $V_{thL}$, the regulator 3 charges the capacitor 6, and when the terminal voltage $V_N$ exceeds the upper limit voltage $V_{thH}$, the regulator 3 discharges the capacitor 6. In other words, the voltage range of $V_{thL} \leq V_N \leq V_{thH}$ is set as the OFF region where the regulator 3 neither charges nor discharges the capacitor 6.

The driver 2 sets the potential of the gate, which is a conduction control terminal, to the voltage level of the power supply 4 when turning on the FET 5 in accordance with a drive control signal input from outside. The voltage level is 15V, for example, based on the circuit ground level. The driver 2 sets the potential of the gate to the circuit ground level of the terminal ICGND when turning off the FET 5.

Next, the effects of the present embodiment will be described. FIG. 1 shows three current paths. As shown, when power is applied to the driving device 1 from the power supply 4, the regulator 3 charges the capacitor 6 via current path (1) to set the terminal voltage $V_N$ at 5V. As a result, when the potential of the reference ground is 0V, the potential of the circuit ground is −5V.

In order to turn on the FET 5, the driver 2 stores charge between the gate and source of the FET 5 with the power supply 4 via current path (2). At this time, the capacitor 6 connected between the source and the terminal ICGND is also charged. In order to turn off the FET 5, the driver 2 discharges the gate of the FET 5 via current path (3) of the terminal ICGND, the capacitor 6, and the source. In other words, the driver 2 turns on and off the FET 5 by changing the gate potential of the FET 5 between two levels, i.e., ±5V.

Figure 2:
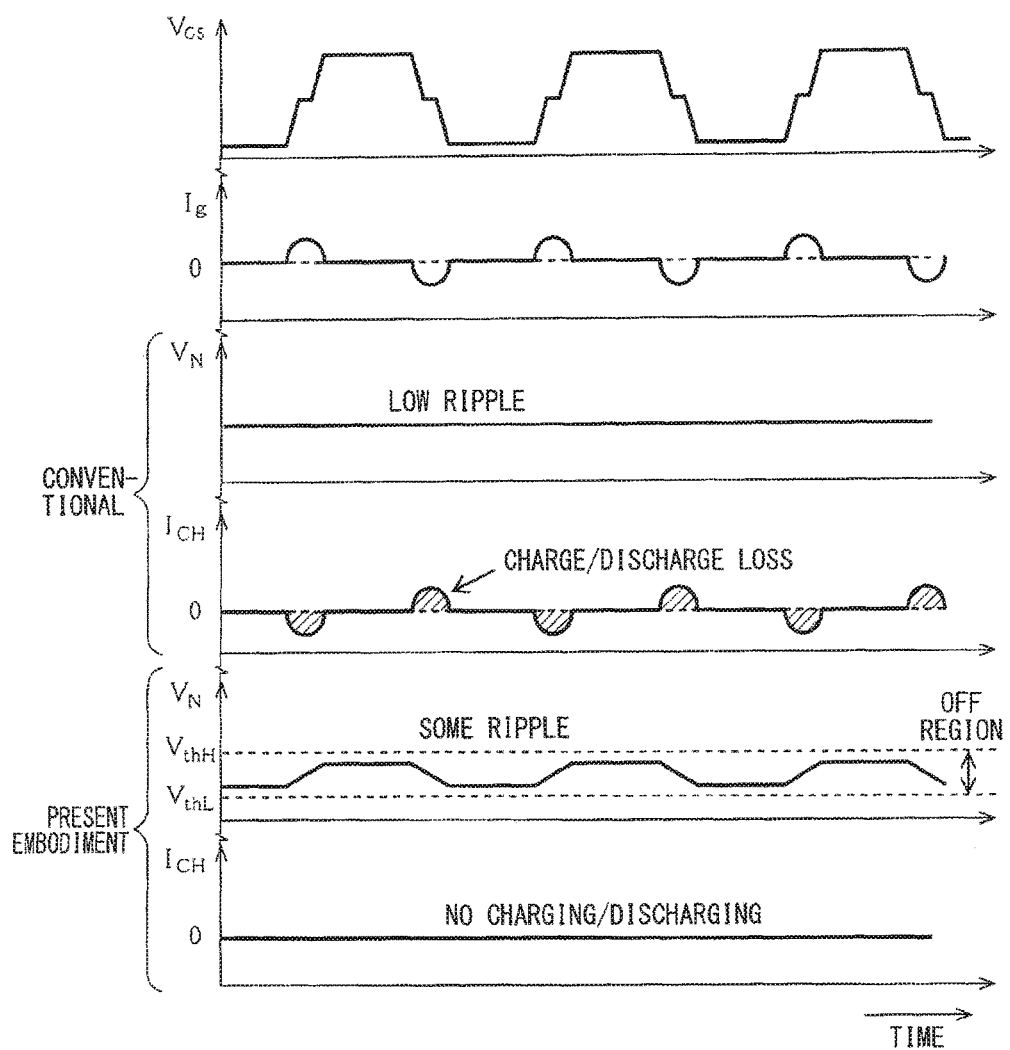
FIG. 2 is an operation timing chart illustrating the first embodiment and a conventional configuration.

As shown in FIG. 2, every time the FET 5 is turned on and off, a gate current $I_g$ flows in a charging direction and a discharging direction. Unlike the present embodiment, in a conventional configuration in which a regulator without the OFF region setting is used, every time the gate current $I_g$ flows, the regulator operates to rapidly discharge or charge the capacitor 6 so as to keep the terminal voltage $V_N$ constant. As a result, the ripple of the terminal voltage $V_N$ is made very small.

In contrast, in the present embodiment, the capacitance of the capacitor 6, the upper limit voltage $V_{thH}$, and the lower limit voltage $V_{thL}$ are set such that the range of fluctuations of terminal voltage $V_N$ caused by the turning on and off of the FET 5 by the driver 2 falls within the voltage range of the OFF region. As a result, while the ripple is larger than that of the conventional configuration due to the fluctuations of terminal voltage $V_N$ as the FET 5 is turned on and off, no current is consumed since the regulator 3 does not charge or discharge the capacitor 6.

The upper limit voltage $V_{thH}$ and lower limit voltage $V_{thL}$ are given such that the voltage range will be ±0.2V around 5V, for example. Cases where the terminal voltage $V_N$ fluctuates beyond the voltage range defined by the upper limit voltage $V_{thH}$ and the lower limit voltage $V_{thL}$ so that the regulator 3 performs charging and discharging will be shown in a second embodiment and onwards.

As described above, according to the present embodiment, the driver 2 is connected between the power supply 4 and the circuit ground, while the capacitor 6 is connected between the circuit ground terminal ICGND and the reference ground terminal PGND to which the source of the FET 5 is connected. The regulator 3, which charges and discharges the capacitor 6 to keep the terminal voltage of the capacitor 6 at a predetermined level, discharges the capacitor when the terminal voltage $V_N$ exceeds the upper limit voltage $V_{thH}$, and charges the capacitor when the terminal voltage $V_N$ falls below the lower limit voltage $V_{thL}$.

With this configuration, fluctuations of terminal voltage $V_N$ will occur within a fixed range since the charge of the capacitor 6 when it is charged and discharged as the driver 2 turns on and off the FET 5 is basically equal. Thus, by appropriately setting the capacitance of the capacitor 6 in relation to the capacity of the FET 5, it may be possible to fall the fluctuations of terminal voltage $V_N$ within the voltage range from the lower limit voltage $V_{thL}$ to the upper limit voltage $V_{thH}$ that are set for the regulator 3. Since the regulator 3 does not perform charging and discharging and no current is consumed as long as the driver 2 only turns on and off the FET 5, it may be possible to reduce the amount of current consumption as compared to conventional configurations.

Second Embodiment

Figure 3:
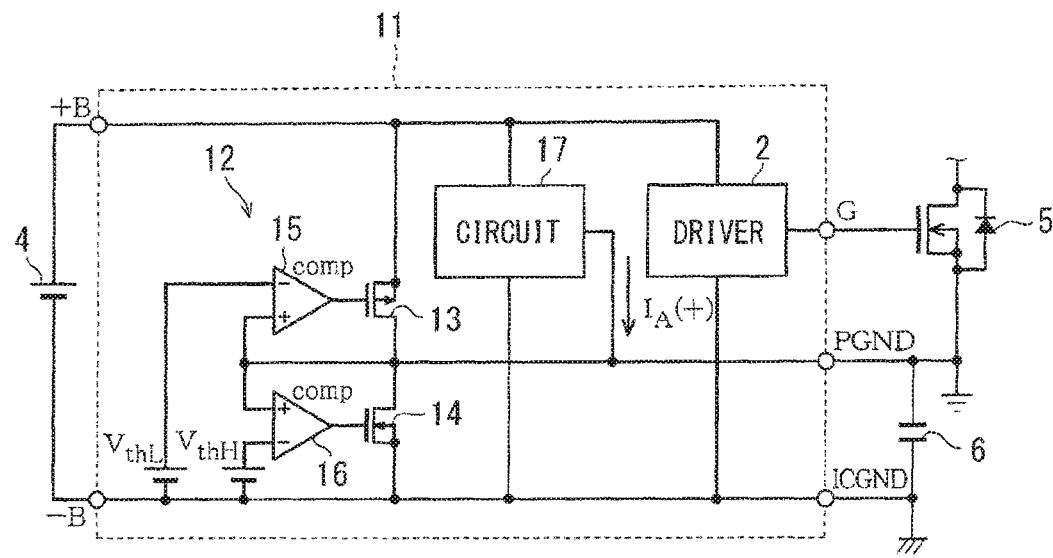
FIG. 3 is a diagram illustrating an electrical configuration of a driving device according to a second embodiment.

As shown in FIG. 3, in the driving device 11 of the second embodiment, a regulator 12, which corresponds to the regulator 3, is configured by a MOSFET and a comparator. A series circuit of a P-channel MOSFET 13, which corresponds to a charger (also referred to as charging means) and a positive switching element, and an N-channel MOSFET 14, which corresponds to a discharger (also referred to as discharging means) and a negative switching element, is connected between the power supply terminals +B and −B, with the common connection point being connected to the terminal PGND.

Output terminals of the comparators 15 and 16 are connected to the gates of the FETs 13 and 14 respectively, and non-inverting input terminals of the comparators 15 and 16 are both connected to the terminal PGND. A lower limit voltage $V_{thL}$ is given to an inverting input terminal of the comparator 15, which corresponds to a charge controller (also referred to as charge control means), while an upper limit voltage $V_{thH}$ is given to an inverting input terminal of the comparator 16, which corresponds to a discharge controller (also referred to as discharge control means).

The driving device 11 also includes another control circuit (also referred to as a different control circuit) 17 connected between the power supply terminals +B and −B. The output terminal of the other control circuit 17 is connected to the terminal PGND. This other control circuit 17 charges and discharges the capacitor 6 as the circuit operates. An example of the other control circuit 17 is a communication circuit that reports to an upper level control circuit when the other control circuit detects an abnormal state. Examples of abnormal state include the following:

Detection of an overheated state of the driving device 11;
Detection of overcurrent through the FET 5; and
Voltage drop of the power supply 4.

A failure signal is output when any of these abnormal states is detected. Limits are imposed on the functions of the driving device 11, and the communication circuit reports to an upper level control circuit.

Another example of the other control circuit 17 is an OFF holding circuit that prevents self turn-on of the FET 5 during the OFF period, or a logic circuit that controls the circuits described above, and so on.

Figure 4:
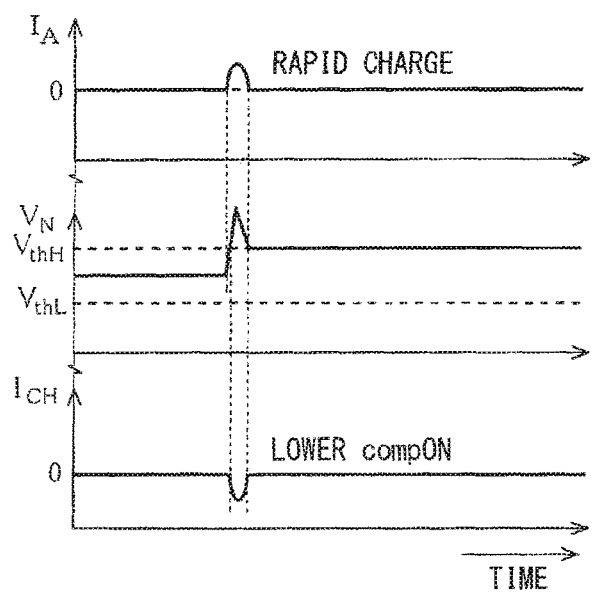
FIG. 4 is an operation timing chart of a case when rapid charging occurs resulting from another control circuit.
Figure 5:
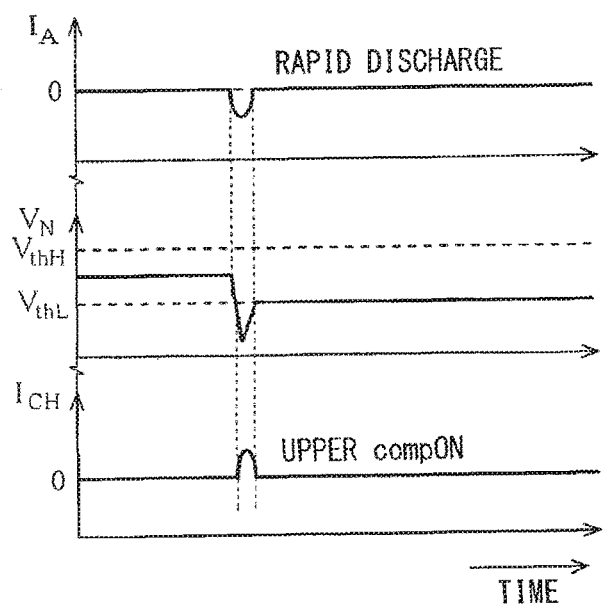
FIG. 5 is an operation timing chart of a case when rapid discharging occurs resulting from another control circuit.

Next, the effects of the second embodiment will be described. As shown in FIG. 4, when the capacitor 6 is rapidly charged with a circuit operation of the other control circuit 17, and the terminal voltage $V_N$ fluctuates beyond the upper limit voltage $V_{thH}$, the comparator 16 (lower comp) turns on the FET 14 and discharges the capacitor 6. On the other hand, as shown in FIG. 5, when the capacitor 6 is rapidly discharged with a circuit operation of the other control circuit 17, and the terminal voltage $V_N$ fluctuates below the lower limit voltage $V_{thL}$, the comparator 15 (upper comp) turns on the FET 13 and charges the capacitor 6.

Figure 6:
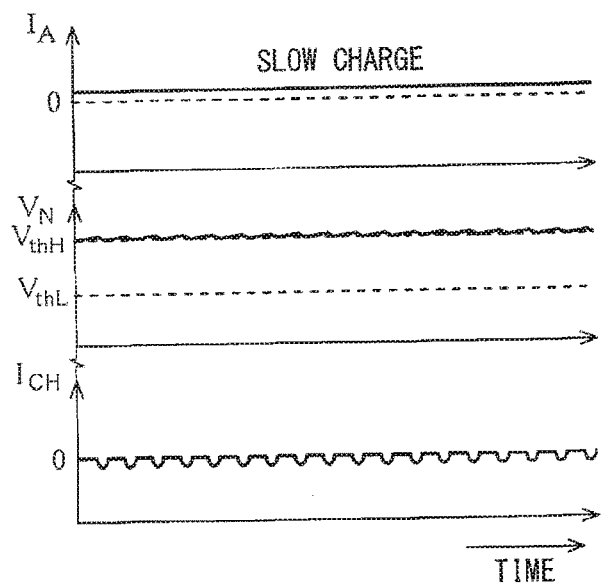
FIG. 6 is an operation timing chart of a case when slow and continuous charging occurs resulting from another control circuit.
Figure 7:
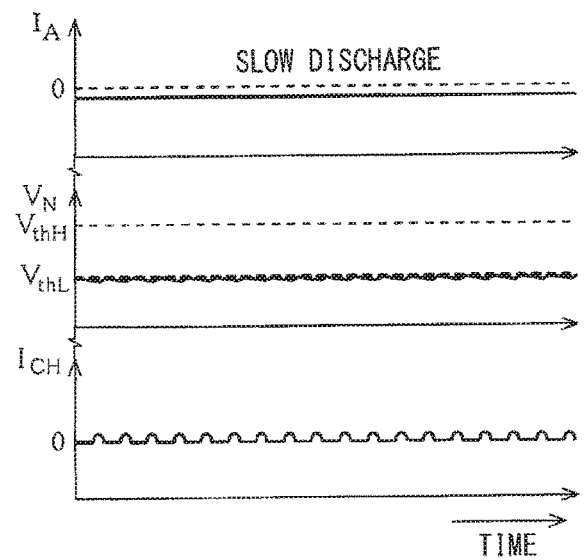
FIG. 7 is an operation timing chart of a case when slow and continuous discharging occurs resulting from another control circuit.

When the capacitor 6 is slowly and continuously charged with a circuit operation of the other control circuit 17 as shown in FIG. 6, and the terminal voltage $V_N$ fluctuates near the upper limit voltage $V_{thH}$, the comparator 16 turns on the FET 14 intermittently and discharges the capacitor 6 intermittently. When the capacitor 6 is slowly and continuously discharged with a circuit operation of the other control circuit 17 as shown in FIG. 7, and the terminal voltage $V_N$ fluctuates near the lower limit voltage $V_{thL}$, the comparator 15 turns on the FET 13 intermittently and charges the capacitor 6 intermittently.

According to the second embodiment, as described above, the regulator 12 with an OFF region is configured with a series circuit of FETs 13 and 14, and comparators 15 and 16 that control ON and OFF of these FETs, so that it may be possible to rapidly charge and discharge the capacitor 6 when the terminal voltage $V_N$ of the capacitor 6 fluctuates beyond the voltage range defined by the upper limit voltage $V_{thH}$ and lower limit voltage $V_{thL}$.

Third Embodiment

Figure 8:
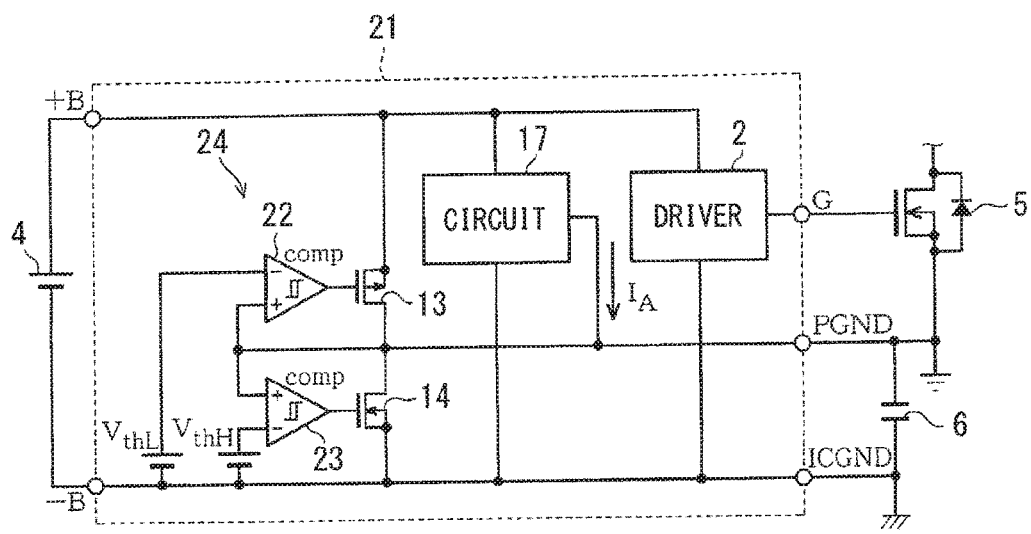
FIG. 8 is a diagram illustrating an electrical configuration of a driving device according to a third embodiment.

The driving device 21 of the third embodiment includes, as shown in FIG. 8, a regulator 24 having comparators 22 and 23 with a hysteresis instead of the comparators 15 and 16 used to form the driving device 11.

Figure 9:
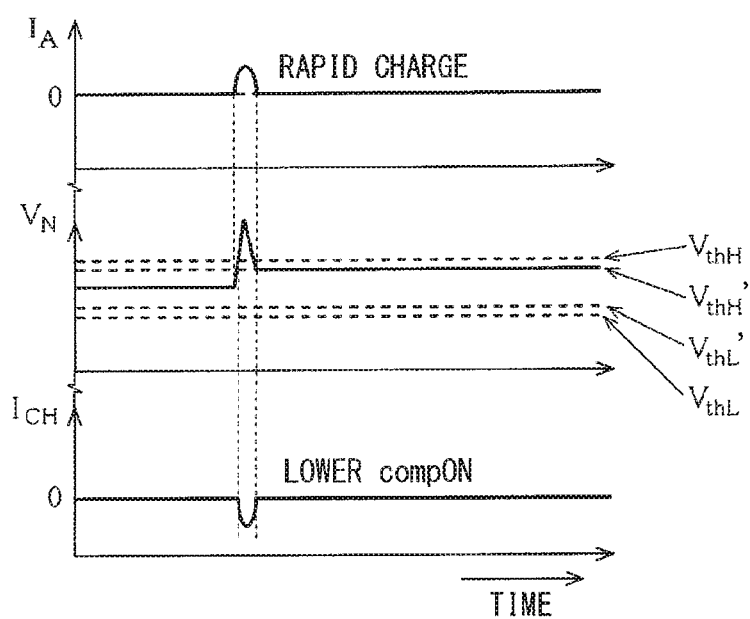
FIG. 9 is an operation timing chart of a case when rapid charging occurs resulting from another control circuit.
Figure 10:
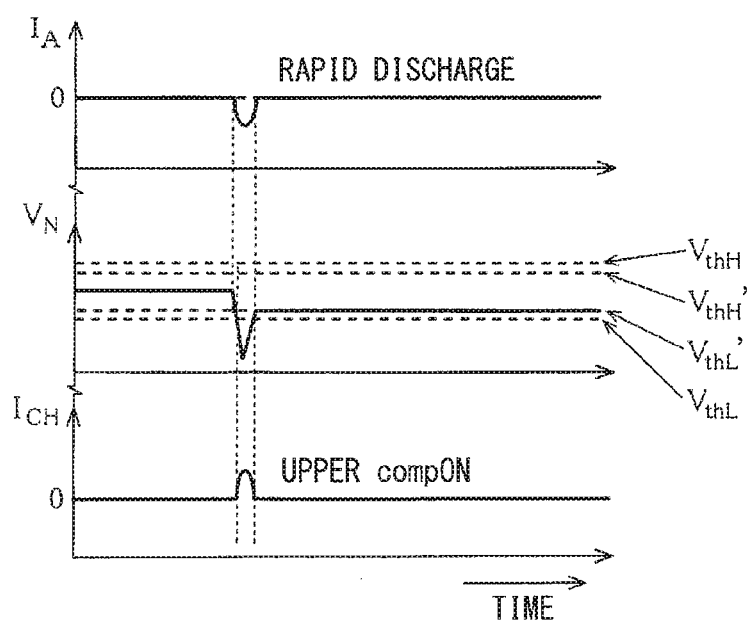
FIG. 10 is an operation timing chart of a case when rapid discharging occurs resulting from another control circuit.

Next, the effects of the third embodiment will be described. As shown in FIG. 9, when the capacitor 6 is rapidly charged with a circuit operation of another control circuit 17, and the terminal voltage $V_N$ fluctuates beyond the upper limit voltage $V_{thH}$, the comparator 23 turns on the FET 14 and discharges the capacitor 6. The discharging continues until the terminal voltage $V_N$ reaches the upper limit voltage $V_{thH}'$. On the other hand, as shown in FIG. 10, when the capacitor 6 is rapidly discharged with a circuit operation of the other control circuit 17, and the terminal voltage $V_N$ fluctuates below the lower limit voltage $V_{thL}$, the comparator 22 turns on the FET 13 and charges the capacitor 6. The charging continues until the terminal voltage $V_N$ reaches the lower limit voltage $V_{thL}'$.

Figure 11:
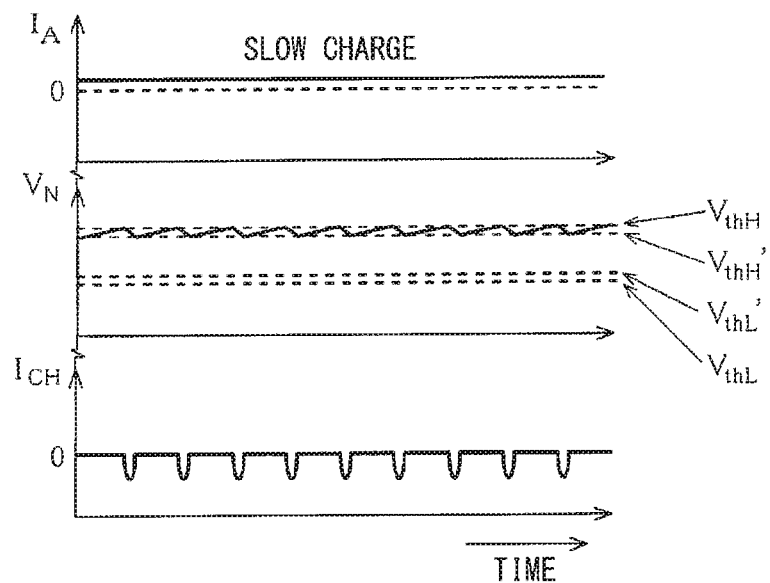
FIG. 11 is an operation timing chart of a case when slow and continuous charging occurs resulting from another control circuit.
Figure 12:
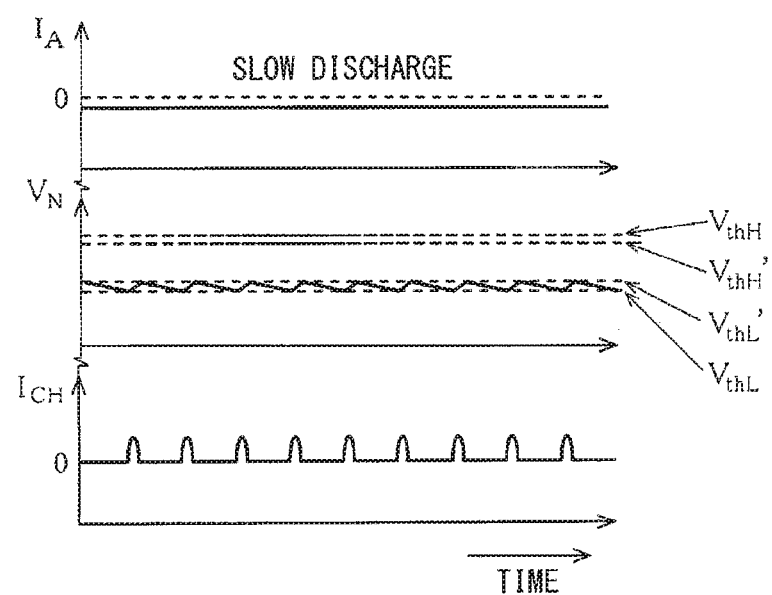
FIG. 12 is an operation timing chart of a case when slow and continuous discharging occurs resulting from another control circuit.

When the capacitor 6 is slowly and continuously charged with a circuit operation of the other control circuit 17 as shown in FIG. 11, and the terminal voltage $V_N$ fluctuates near the upper limit voltage $V_{thH}$, the comparator 23 turns on the FET 14 intermittently and discharges the capacitor 6 intermittently. The terminal voltage $V_N$ at this time fluctuates in the hysteresis range from $V_{thH}'$ to $V_{thH}$ of the upper limit voltage. When the capacitor 6 is slowly and continuously discharged with a circuit operation of the other control circuit 17 as shown in FIG. 12, and the terminal voltage $V_N$ fluctuates near the lower limit voltage $V_{thL}$, the comparator 22 turns on the FET 13 intermittently and charges the capacitor 6 intermittently. The terminal voltage $V_N$ at this time fluctuates in the hysteresis range from $V_{thL}$ to $V_{thL}'$ of the lower limit voltage.

According to the third embodiment, as described above, the regulator 24 with an OFF region is configured with a series circuit of FETs 13 and 14, and comparators 22 and 23 with a hysteresis that control ON and OFF of these FETs, so that it may be possible to rapidly charge and discharge the capacitor 6 when the terminal voltage $V_N$ of the capacitor 6 fluctuates beyond the voltage range defined by the upper limit voltage $V_{thH}$ and lower limit voltage $V_{thL}$ similarly to the second embodiment.

When the capacitor 6 is slowly and continuously charged or discharged, the terminal voltage $V_N$ fluctuates in the hysteresis range from $V_{thL}$ to $V_{thL}'$ of the lower limit voltage, or in the hysteresis range from $V_{thH}'$ to $V_{thH}$ of the upper limit voltage. This way, it may be possible to make the terminal voltage $V_N$ be closer to a median between the upper limit voltage $V_{thH}$ and the lower limit voltage $V_{thL}$.

Fourth Embodiment

Figure 13:
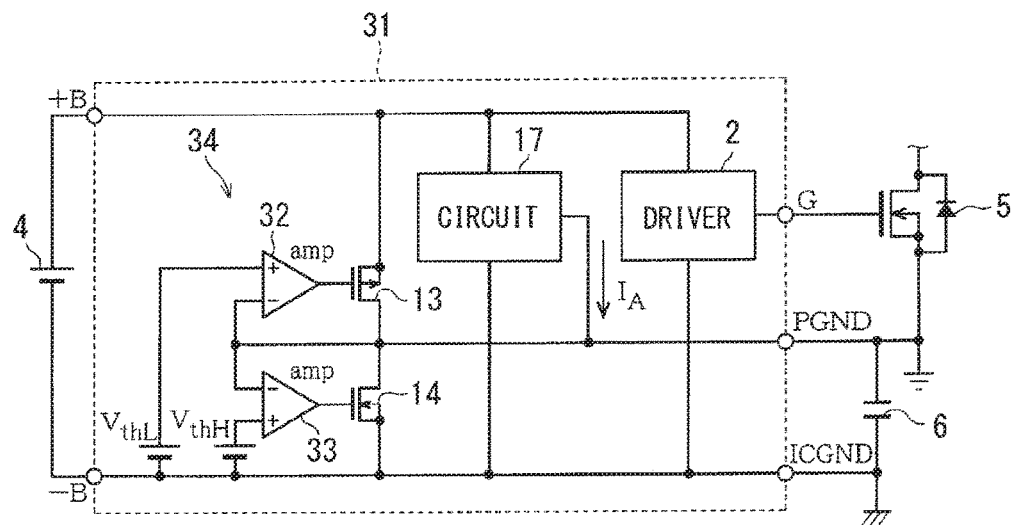
FIG. 13 is a diagram illustrating an electrical configuration of a driving device according to a fourth embodiment.
Figure 14:
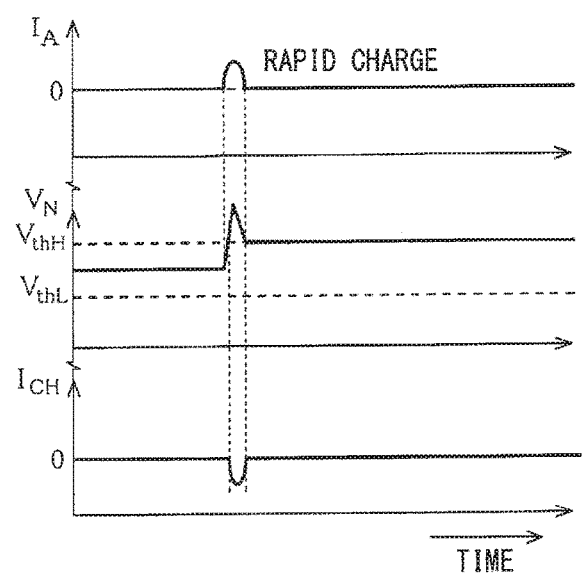
FIG. 14 is an operation timing chart of a case when rapid charging occurs resulting from another control circuit.
Figure 15:
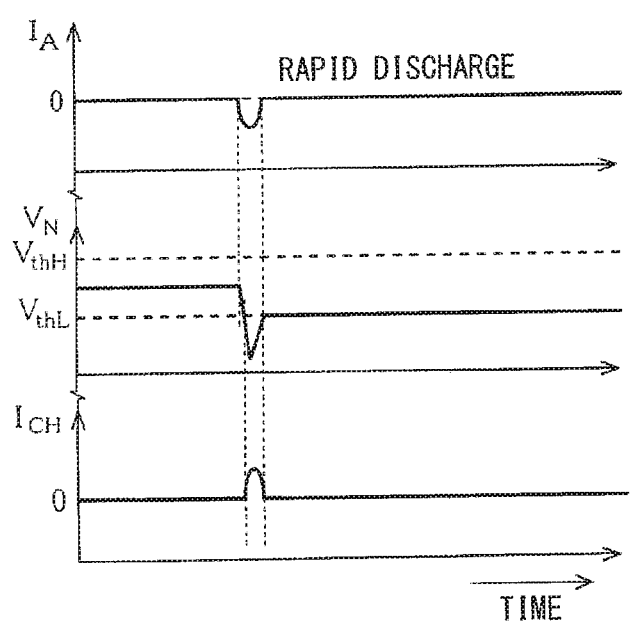
FIG. 15 is an operation timing chart of a case when rapid discharging occurs resulting from another control circuit.

The driving device 31 of the fourth embodiment includes, as shown in FIG. 13, a regulator 34 having an operational amplifier 32 that is a charge controller and an operational amplifier 33 that is a discharge controller instead of the comparators 15 and 16 used to form the driving device 11. Next, the effects of the fourth embodiment will be described. As shown in FIG. 14 and FIG. 15, the operations in cases where the capacitor 6 is rapidly charged and discharged with circuit operations of the other control circuit 17 are similar to those of the second embodiment.

Figure 16:
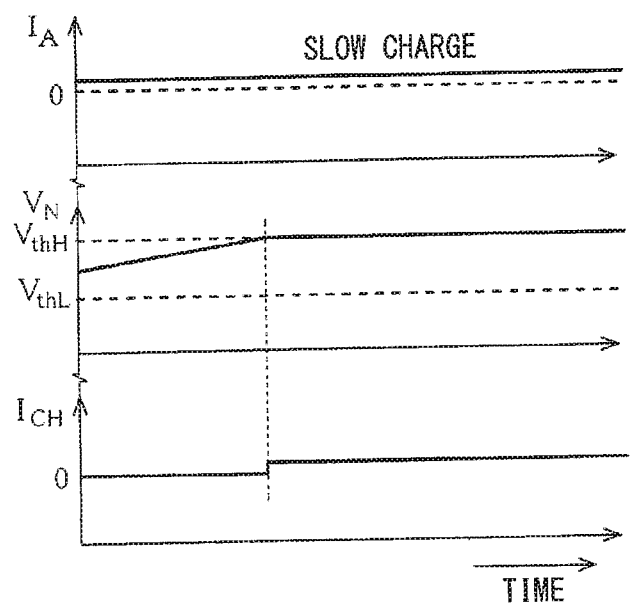
FIG. 16 is an operation timing chart of a case when slow and continuous charging occurs resulting from another control circuit.

When the capacitor 6 is slowly and continuously charged with a circuit operation of the other control circuit 17 as shown in FIG. 16, the operational amplifier 33 turns on the FET 14 to start discharging the capacitor 6 when the terminal voltage $V_N$ reaches the upper limit voltage $V_{thH}$. From then on, the operational amplifier 33 controls the FET 14 linearly, such that a discharge current equivalent to the charge current supplied by another control circuit 17 flows continuously.

Figure 17:
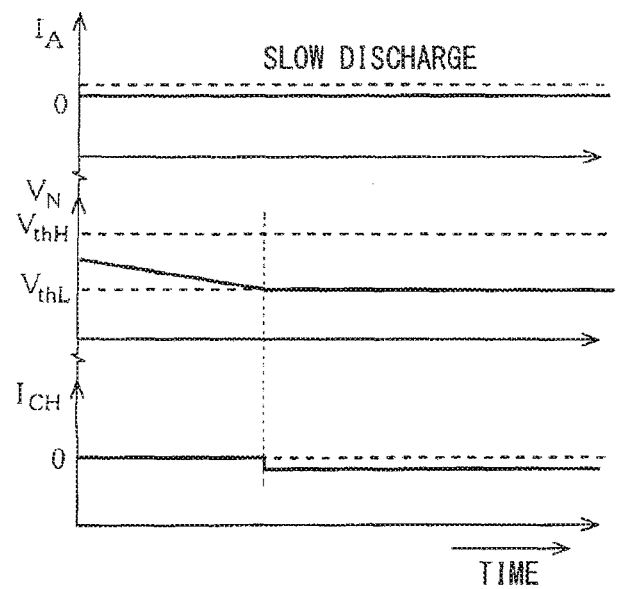
FIG. 17 is an operation timing chart of a case when slow and continuous discharging occurs resulting from another control circuit.

When the capacitor 6 is slowly and continuously discharged with a circuit operation of another control circuit 17 as shown in FIG. 17, the operational amplifier 32 turns on the FET 13 to start charging the capacitor 6 when the terminal voltage $V_N$ reaches the lower limit voltage $V_{thL}$. From then on, the operational amplifier 32 controls the FET 13 linearly, such that a charge current equivalent to the discharge current supplied by the other control circuit 17 flows continuously.

According to the fourth embodiment, as described above, the regulator 34 with an OFF region is configured with a series circuit of FETs 13 and 14, and operational amplifiers 32 and 33 that control ON and OFF of these FETs, so that it may be possible to charge and discharge the capacitor 6 without increasing the ripple when the terminal voltage $V_N$ of the capacitor 6 fluctuates beyond the voltage range defined by the upper limit voltage $V_{thH}$ and lower limit voltage $V_{thL}$.

Fifth Embodiment

Figure 18:
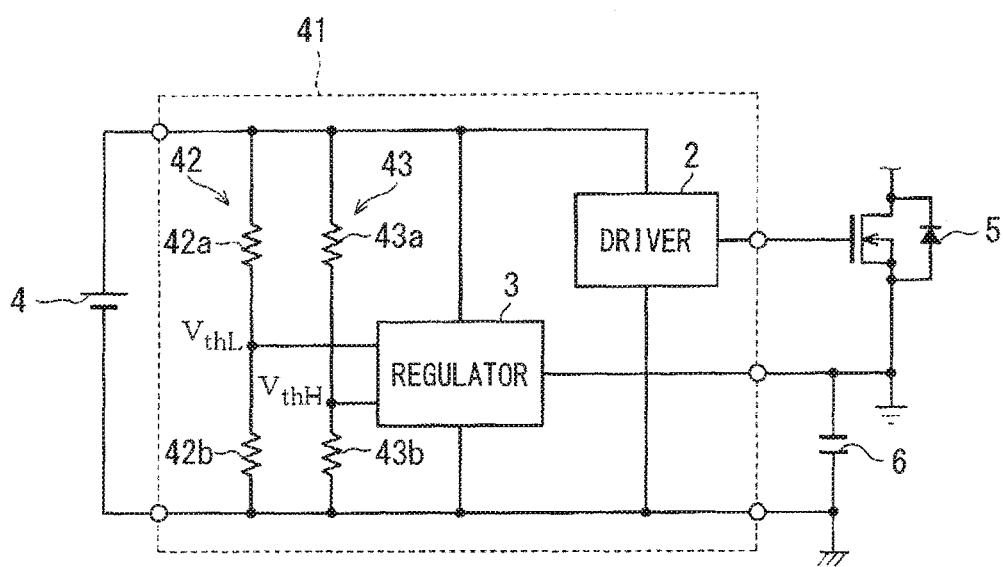
FIG. 18 is a diagram illustrating an electrical configuration of a driving device according to a fifth embodiment.

As shown in FIG. 18, the driving device 41 of the fifth embodiment includes resistance voltage divider circuits 42 and 43, specifically, as the configuration in the driving device 1 of the first embodiment for applying a lower limit voltage $V_{thL}$ and an upper limit voltage $V_{thH}$. The resistance voltage divider circuit 42 is formed by a series circuit of resistor elements 42a and 42b connected between the power supply terminals +B and −B, and adjusts the voltage division ratio such that the potential at their common connection point equals to the lower limit voltage $V_{thL}$. Similarly, the resistance voltage divider circuit 43 is formed by a series circuit of resistor elements 43a and 43b connected between the power supply terminals +B and −B, and adjusts the voltage division ratio such that the potential at their common connection point equals to the upper limit voltage $V_{thH}$.

Sixth Embodiment

Figure 19:
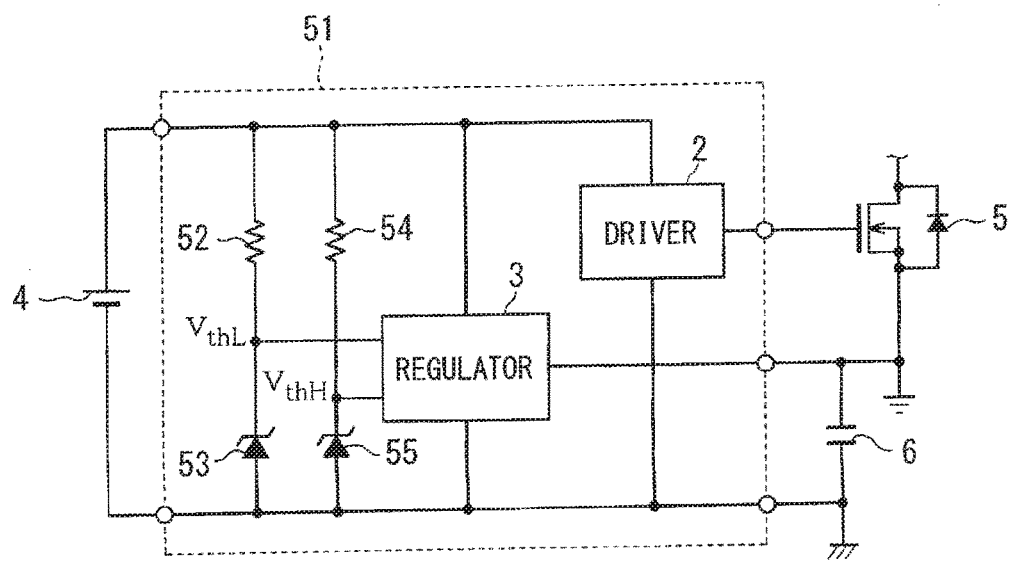
FIG. 19 is a diagram illustrating an electrical configuration of a driving device according to a sixth embodiment.

As shown in FIG. 19, the driving device 51 of the sixth embodiment includes, specifically as the configuration in the driving device 1 of the first embodiment for applying a lower limit voltage $V_{thL}$ and an upper limit voltage $V_{thH}$, a series circuit of a resistor element 52, which is an energizing part (also referred to as energizing means), and a Zener diode 53, and a series circuit of a resistor element 54, which is also an energizing part, and a Zener diode 55, connected between the power supply terminals +B and −B. In this case, the lower limit voltage $V_{thL}$ and upper limit voltage $V_{thH}$ are applied by the Zener voltage of the Zener diodes 53 and 55.

Seventh Embodiment

Figure 20:
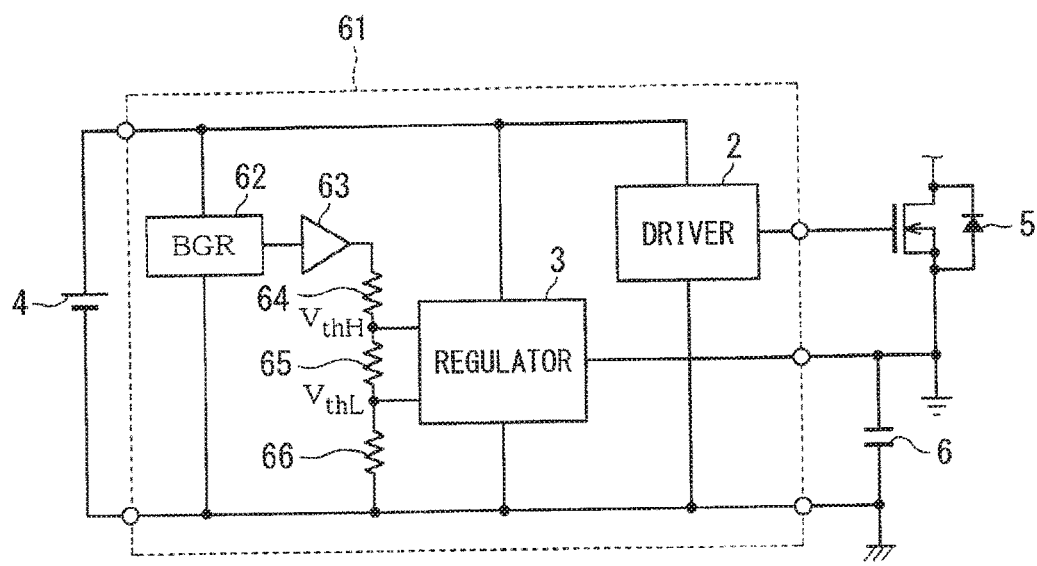
FIG. 20 is a diagram illustrating an electrical configuration of a driving device according to a seventh embodiment.

As shown in FIG. 20, the driving device 61 of the seventh embodiment includes, specifically as the configuration in the driving device 1 of the first embodiment for applying a lower limit voltage $V_{thL}$ and an upper limit voltage $V_{thH}$, a series circuit of a band gap reference circuit 62 denoted as "BGR" in the drawing, an operational amplifier 63, and resistor elements 64 to 66. The band gap reference circuit 62 is connected between the power supply terminals +B and −B, and generates and outputs a band gap reference voltage of about 1.2V, for example. The operational amplifier 63 amplifies the band gap reference voltage, and the amplified voltage is divided by the series circuit of the resistor elements 64 to 66. The voltage is adjusted such that the potential at the common connection point of the resistor elements 64 and 65 equals to the upper limit voltage $V_{thH}$, and the potential at the common connection point of the resistor elements 65 and 66 equals to the lower limit voltage $V_{thL}$.

Eighth Embodiment

Figure 21:
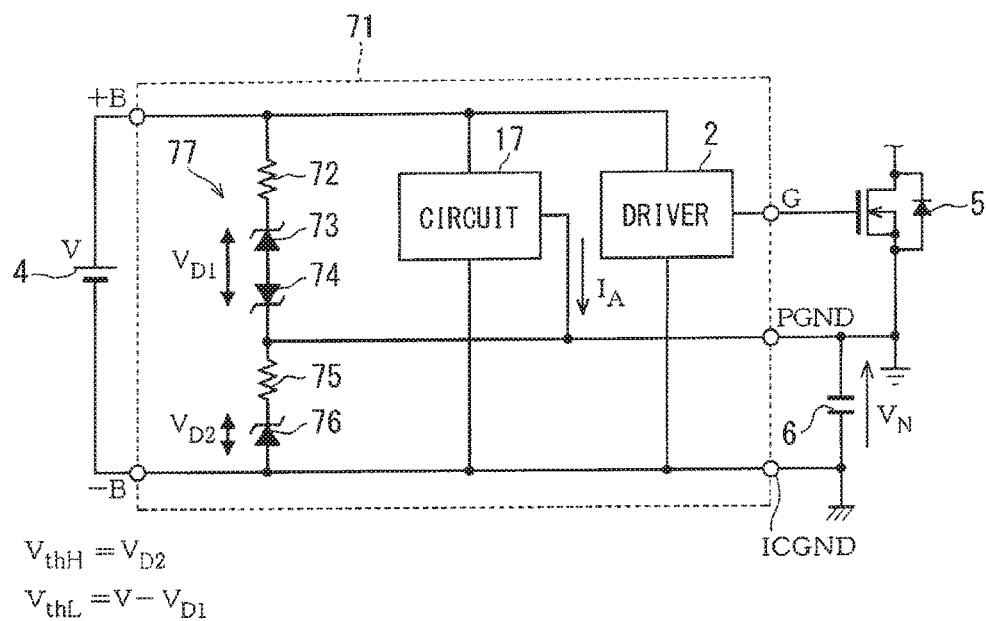
FIG. 21 is a diagram illustrating an electrical configuration of a driving device according to an eighth embodiment.

As shown in FIG. 21, in the driving device 71 of the eighth embodiment, a series circuit, including a resistor element 72 (also referred to as first energizing part), Zener diodes 73 and 74, a resistor element 75 (also referred to as second energizing part), and a Zener diode 76, is connected between the power supply terminals +B and −B, these parts forming a regulator 77. The first Zener diode 73 and the second Zener diode 74 are connected to share their anodes, and form a charge controller together with the resistor element 72. The resistor element 75 and the Zener diode 76, which is the third Zener diode, form a discharge controller.

The upper limit voltage $V_{thH}$ and the lower limit voltage $V_{thL}$ are as follows, wherein V represents the voltage at the power supply 4, $V_{D1}$ represents the sum of the Zener voltage of the Zener diode 73 and the forward voltage of the Zener diode 74, and $V_{D2}$ represents the Zener voltage of the Zener diode 76. The voltage V of the power supply 4 corresponds to one example of voltage of the element driving power supply.

$$V_{thH} = V_{D2}$$

$$V_{thL} = V - V_{D1}$$

Next, the effects of the eighth embodiment will be described.

(When $V_{thH} \geq V_N \geq V_{thL}$)

The voltage applied to each of the Zener diodes 73, 74, and 76 is lower than their breakdown voltages, so that the regulator 77 does not charge or discharge the capacitor 6.

(When $V_N > V_{thH}$)

The Zener diode 76 is turned on and the capacitor 6 is discharged. When discharging is complete, the Zener diode 76 is turned off.

(When $V_{thL} > V_N$)

The Zener diodes 73 and 74 are turned on and the capacitor 6 is charged. When charging is complete, the Zener diodes 73 and 74 are turned off.

As described above, according to the eighth embodiment, the regulator 77 is formed by a series circuit including the resistor element 72, Zener diodes 73 and 74, resistor element 75, and Zener diode 76 and connected between the power supply terminals +B and −B. This way, it may be possible to configure the regulator 77 most simply.

The present disclosure is not limited to the embodiments described above or illustrated in the drawings, and the following modifications and extensions are possible.

The configuration that applies the lower limit voltage $V_{thL}$ and the upper limit voltage $V_{thH}$ is not limited to those shown from the fifth to seventh embodiments, and may be a voltage reference circuit having other configurations.

The resistor elements 52 and 54 of the sixth embodiment, and the resistor elements 72 and 75 of the eighth embodiment may be replaced with constant current sources, which are energizing parts.

The positive and negative switching elements are not limited to MOSFETs, and may be bipolar transistors. The driving switching element may be a voltage-driven switching element such as an IGBT.

In the configuration described above, when power is input to the driving device, the regulator performs initial charging on the capacitor until the lower limit value is exceeded, so that the potential of the circuit ground becomes lower than the reference ground by the terminal voltage of the capacitor. For example, when the reference ground is 0V, the potential will be negative for the circuit ground. The drive circuit charges the conduction control terminal of the driving switching element when turning on the driving switching element. The charge current flowing at this time also charges the capacitor via the potential reference side conduction terminal.

The drive circuit discharges the driving switching element from the conduction control terminal when turning the driving switching element off. The discharge current flowing at this time also discharges the capacitor via the potential reference side conduction terminal. Since the drive circuit can drive the conduction control terminal to have a negative potential at this time, it may be possible to prevent self turn-on of the driving switching element.

Since the charge of the capacitor when it is charged and discharged as the drive circuit turns on and off the driving switching element is basically equal, the terminal voltage fluctuations of the capacitor will occur within a fixed range. Thus, by appropriately setting the capacitance of the capacitor in relation to the capacity of the driving switching element, the terminal voltage fluctuations can be made to fall within the voltage range from the lower limit value to the upper limit value that are set for the regulator.

Since the voltage range corresponds to the OFF region where the regulator does not operate, the regulator does not perform charging or discharging and does not consume any current when the drive circuit only turns on and off the driving switching element. The regulator operates when the terminal voltage fluctuates beyond the voltage range due to other factors to charge or discharge the capacitor. Thus, it may be possible to reduce the current consumption as compared to conventional configurations.

While various embodiments, configurations, and aspects of the switching element driving device have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

The invention claimed is:

1. A switching element driving device comprising:
    a drive circuit that is connected between an element driving power supply and a circuit ground and outputs a driving signal to a driving switching element;
    a capacitor that is connected between the circuit ground and a reference ground, to which a potential reference side conduction terminal of the driving switching element is connected; and
    a regulator that charges and discharges the capacitor so as to keep a predetermined terminal voltage of the capacitor,
    wherein:
    the regulator discharges the capacitor when the terminal voltage exceeds an upper limit value, and charges the capacitor when the terminal voltage falls below a lower limit value.

2. The switching element driving device according to claim 1, wherein:
    the regulator includes
        a charger that charges the capacitor,
        a discharger that discharges the capacitor,
        a charge controller that controls the charger, and
        a discharge controller that controls the discharger;
    the charge controller causes the charger to operate when the terminal voltage falls below the lower limit value; and
    the discharge controller causes the discharger to operate when the terminal voltage exceeds the upper limit value.

3. The switching element driving device according to claim 2, wherein:
    the charge controller and the discharge controller are configured by comparators.

4. The switching element driving device according to claim 3, wherein:
    the comparators are comparators with a hysteresis.

5. The switching element driving device according to claim 2, wherein:
    the charge controller and the discharge controller are configured by operational amplifiers.

6. The switching element driving device according to claim 2, wherein:
    the charger and the discharger are configured by a series circuit including a positive switching element and a negative switching element, the series circuit being connected between the element driving power supply and the circuit ground; and
    a common connection point of the series circuit is connected to the reference ground.

7. The switching element driving device according to claim 2, wherein:
    the charge controller is provided by a first energizing part having a first end connected to the element driving power supply, a first Zener diode having a cathode connected to a second end of the first energizing part, and a second Zener diode having an anode connected to an anode of the first Zener diode;

the discharge controller is provided by a second energizing part having a first end connected to a cathode of the second Zener diode, and a third Zener diode having a cathode connected to a second end of the second energizing part and an anode connected to the circuit ground;

the upper limit value is applied as a Zener voltage of the third Zener diode; and the lower limit value is applied as a voltage obtained by subtracting a sum of a Zener voltage of the first Zener diode and a forward voltage of the second Zener diode from a voltage of the element driving power supply.

8. The switching element driving device according to claim 1, wherein:

the upper limit value and the lower limit value are both generated by resistance voltage divider circuits connected between the element driving power supply and the circuit ground.

9. The switching element driving device according to claim 1, wherein:

the upper limit value and the lower limit value are both generated by a series circuit of energizing parts and Zener diodes, each being connected between the element driving power supply and the circuit ground.

10. The switching element driving device according to claim 1, further comprising:

a band gap reference circuit that is connected between the element driving power supply and the circuit ground; and resistance voltage divider circuits that divide an output voltage of the band gap reference circuit, wherein:

the upper limit value and the lower limit value are generated by the resistance voltage divider circuits.

* * * * *